INVENTOR.
ROBERT D. HITCHCOCK
BY Joseph H. Golant
ATTORNEY.

*INVENTOR.*
ROBERT D. HITCHCOCK
*BY* Joseph H. Golant
ATTORNEY.

United States Patent Office 3,447,961

Patented June 3, 1969

3,447,961

MOVABLE SUBSTRATE METHOD OF VAPORIZING AND DEPOSITING ELECTRODE MATERIAL LAYERS ON THE SUBSTRATE

Robert D. Hitchcock, Ventura, Calif., assignor to the United States of America as represented by the Secretary of the Navy Filed Mar. 20, 1967, Ser. No. 624,616
Int. Cl. B44d *1/18;* H01l *7/00*
U.S. Cl. 117—212 3 Claims

ABSTRACT OF THE DISCLOSURE

The invention is a thin film superconductive tunnel diode and a method of its manufacture. The diode comprises a sandwich of thin films supported upon a substrate; the films are aluminum, aluminum oxide and lead or tin. Thickness of the diode is about $10^{-5}$ cm. The method of manufacture comprises vaporizing and depositing of aluminum and lead or tin with an oxidizing step after the deposition of aluminum. A double mask arrangement, one of which is movable, allows the method to be carried on at a pressure of about $10^{-3}$ torr.

BACKGROUND OF THE INVENTION

Field of the invention

The present invention relates to superconductive diodes and more particularly to thin film superconductive tunnel diodes and their method of manufacture.

Description of the prior art

Diodes are well known in the prior art and they are usually defined as an electron tube containing two electrodes, an anode and a cathode. Since the advent of the solid state transistor, electronic devices have been rapidly diminishing in size so that today semiconductor devices such as the bulk transistor and the Zener diode are constructed hundreds or even thousands of times smaller than the electron tube and yet still retain the desired electrical characteristics. The search for even smaller electronic components has not yet ended and today research is being done with microelectronic systems. The new devices utilize the electronic properties of thin metallic or semiconductor films. Packaging efficiency is markedly improved through the use of thin film components because of smallness in size. In addition, the use of thin film devices reduces the overall weight of a system.

Presently, thin film capacitors and resistors are used in microelectronic circuitry. But as yet the functions performed by bulk or monolithic transistors and diodes are not being performed reliably enough by thin film devices to allow their wide use in microelectronic systems. Reproducibility is a major problem in the development of thin film superconductive diodes. In addition, it is believed that manufacturing techniques have not been such as to enable economic manufacture of the thin film superconductive diodes. The prior art is perhaps best illustrated by a patent to J. N. Cooper et al., Patent No. 3,113,889, wherein a method of vacuum depositing superconductive thin films is disclosed. It is noted that a great deal of concern is placed upon the temperature and pressure at which the vacuum depositing is conducted. Because of these pressure and temperature limitations it is believed that the manufacturing of systems using superconductive thin film devices is too expensive and too unpredictable for full scale production. Another of the main problems in the superconductive thin film diode art is the difficulty of reproducing the desired electronic characteristics repeatedly.

SUMMARY OF THE INVENTION

Certain fabrication problems of the prior art are solved by the present invention which includes a process comprising. cleaning a glass substrate; vaporizing and depositing aluminum upon the glass substrate at a pressure of about $10^{-3}$ torr; exposing the deposited aluminum to dry oxygen at a pressure which may range from 0.03 to 40 torr; vaporizing a counter electrode at a pressure of about $10^{-3}$ torr. The counter electrode may be either lead or tin. The finished product may then be a superconductive thin film diode comprising a layered device of glass, aluminum, aluminum oxide and tin or lead. The diode manufactured by the above method is reliable in liquid helium, immersion in liquid helium being necessary for operation in the superconducting state. The method of manufacture, including the necessary manufacturing equipment, is relatively inexpensive thus achieving a technique which may be used on a mass production basis.

An object of the invention is to provide a thin film superconductive tunnel diode which is inexpensively manufactured by a new technique and which will retain its electrical characteristic while immersed in liquid helium for an indefinite period.

Another object of the invention is to provide a method of manufacture of thin film superconductive tunnel diodes which does not require expensive equipment, extremely low pressures or complicated cooling arrangements.

Other objects, advantages and novel features of the invention will become apparent from the following detailed description of the invention when considered in conjunction with the accompanying drawings wherein:

DESCRIPTION OF THE PREFERRED EMBODIMENT

Figure 1:
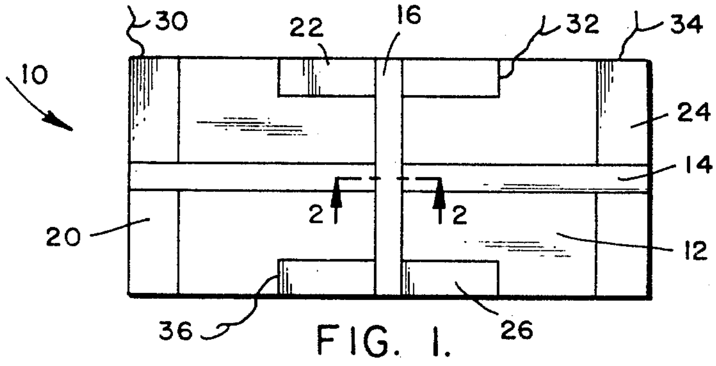
FIG. 1 is a plan view of a preferred embodiment of the invention mounted upon a substrate and adapted to be connected to a circuit.

Referring now to the drawings wherein like reference numerals designate like or corresponding parts throughout the several views, there is shown in FIG. 1 a thin film superconductive diode 10 mounted upon a glass substrate 12 illustrating the right angled deposition of an aluminum and an aluminum oxide strip 14 and a lead or a tin strip 16. At the extremities of the two strips 14 and 16 are indium patches 20, 22, 24 and 26 which may be smeared generally along the edges of the substrate 12 to provide a solder connection for lead wires 30, 32, 34 and 36 which are adapted to connect the diode to an external circuit (not shown).

Figure 2:
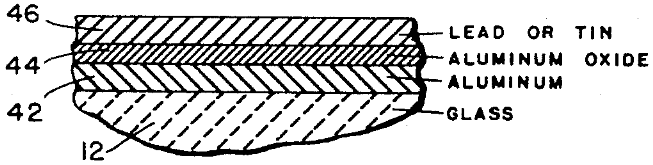
FIG. 2 is an enlarged partial front section view of the preferred embodiment illustrating the several layers forming the diode.

The layers of the individual films are shown enlarged in FIG. 2 with the glass substrates 12 forming a support upon which a base electrode film of aluminum 42 is deposited, an aluminum oxide film 44 being formed immediately upon the aluminum, and a top layer of tin or lead 46 being used as a covering counterelectrode film upon a portion of the oxide film 44.

The thicknesses and sizes of the apparatus are extremely small. The glass substrate 12 shown in FIG. 1 may be 25 x 12 x 1 millimeters, while each of the strips 14 and 16 are approximately 1 millimeter in width. Referring to FIG. 2, the base electrode film of aluminum 42 may be from 2 x $10^{-6}$ to 3 x $10^{-5}$ cm. in thickness, while the oxide film 44 may be from 1 x $10^{-7}$ to 3 x $10^{-7}$ cm. in thickness, and the counterelectrode film of lead or tin 46 may be from 1 x $10^{-5}$ to 3 x $10^{-5}$ cm. in thickness. The thicknesses just recited place the thin film superconductive diode in a thickness range of approximately $10^{-5}$ cm. whereas thick-film or monolithic transistor and diode devices are of the order of $10^{-4}$ cm. or greater in thickness.

The method of manufacturing the thin film superconductive tunnel diode is an integral part of the invention and comprises generally the steps of cleaning a glass substrate, vaporizing aluminum at a pressure of about $10^{-3}$ torr (a torr is a pressure of 1 millimeter of mercury), depositing said aluminum upon the glass substrate, exposing the deposited aluminum to dry oxygen at a pressure ranging from 0.03 to 40 torr, and vaporizing a counterelectrode, which may be lead or tin, at a pressure of about $10^{-3}$ torr.

Figure 3:
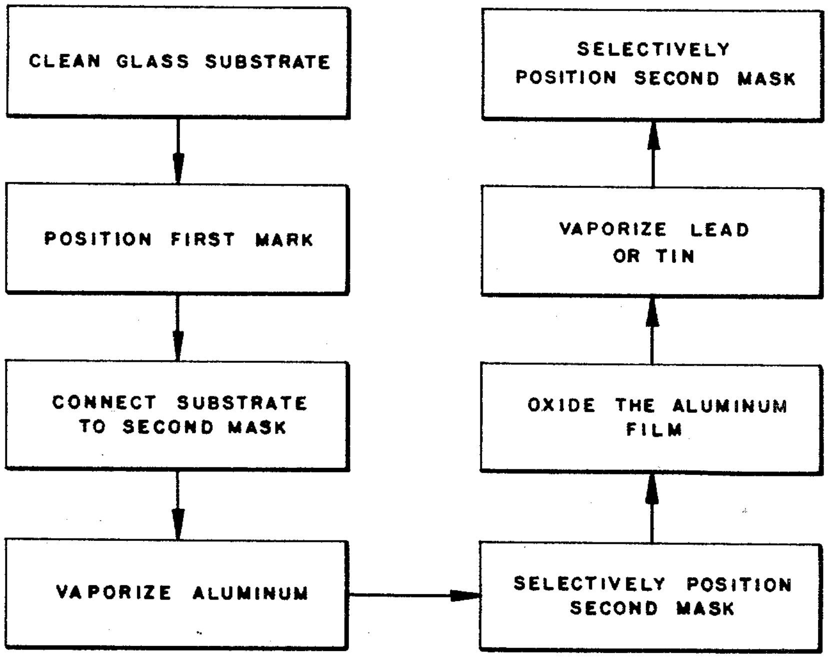
FIG. 3 is a schematic representation of a method of manufacturing the thin film superconductive diode.

In more detail as shown in FIG. 3, the method of manufacture is broken down into individual steps:

Cleaning substrate.—A rectangular piece of the glass may be cut from a microscope slide such that the size of the rectangle is 25 x 12 x 1 millimeters. The glass substrate 12 becomes the basic support for the thin film diode. The substrate may then be cleaned with ethyl alcohol and wiped dry with tissue. No additional cleaning process is necessary. Indium metal patches 20, 22, 24 and 26, FIG. 1, are placed on each of the four edges of the substrate 12 to which wires 30, 32, 34 and 36 may be connected so that the diode may be connected to an external circuit (not shown).

Figure 4:
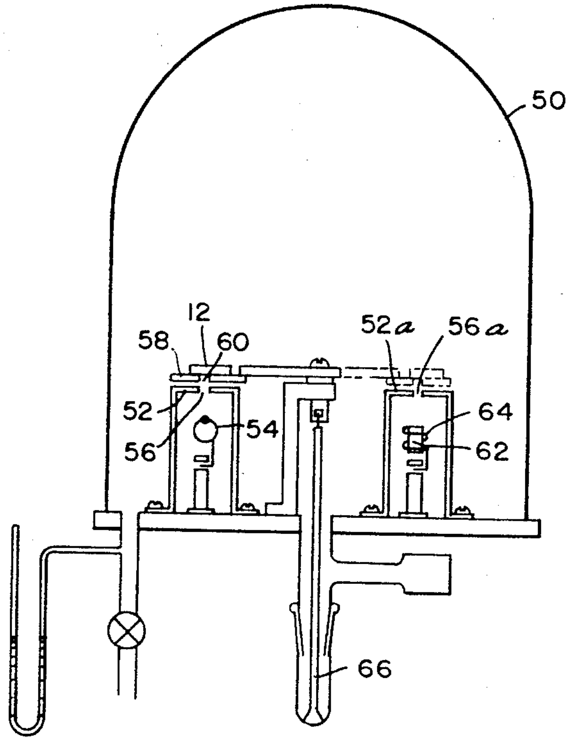
FIG. 4 is a diagrammatic view of a vacuum deposition apparatus which may be used for manufacture of the invention.

Vaporizing aluminum.—The vaporization is done in a vacuum chamber for which is used a glass bell jar 50 (FIG. 4) about 16 inches in diameter by 14 inches high. The pumping system (not shown) consisted of a 2 inch diameter single stage oil diffusion pump with a water-cooled baffle. The mechanical backing pump had a free air capacity of 5 cubic feet per minute. First, a 0.03 inch diameter tungsten wire 54 is formed into a six turn, 7 millimeter diameter helix and secured in the vacuum chamber. Then, 6 pieces of 0.03 inch diameter ⅜ inch long aluminum wire which is 99.99% pure are folded twice and clamped to the tungsten filament on each of the six turns. The aluminum pieces are then melted under a pressure of no greater than $10^{-3}$ torr to form six beads wetting the tungsten wire.

Figure 7:
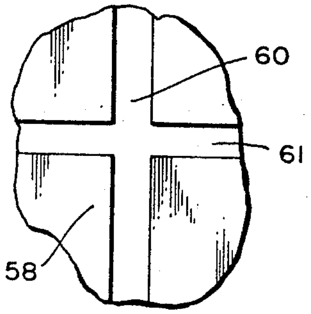
FIG. 7 is an enlarged plan view of a movable mask illustrated in FIG. 4.

Since the aluminum is to be deposited upon the glass substrate in the form of a 1 millimeter wide strip which is about 25 millimeters long, a mask arrangement is necessary. This is accomplished by using two masks fabricated from medium thickness aluminum foil. A first mask 52 containing a 1 x 25 mm. slot 56 is secured in a horizontal plane about 3 cm. above the tungsten filament containing the six aluminum beads. A second mask 58 is movably mounted in a second horizontal plane approximately 1 mm. above the fixed first mask 52. Attached to the top of the movable second mask by any suitable means such as by scotch tape may be the glass substrate 12. Two slots 60 and 61, FIG. 7, approximately 1 mm. in width are cut out of the second mask, one slot perpendicular to the other slot, such that the longer slot 60 which is approximately 25 mm. long may be moved over and align with the 25 mm. long slot 56. The second slot 61, extending perpendicular to slot 60 is approximately 12 mm. in length and may cross the 25 mm. length slot 60 approximately at its midpoint.

The aluminum beads are heated until they are liquid by passing 25 amperes of current through the tungsten filament for about 30 seconds, the pressure in the vacuum chamber should be held below $10^{-3}$ torr. While the aluminum beads are being heated the movable mask 58 with the attached substrate is positioned away from the fixed mask 52, that is, not in alignment with the fixed mask. After the 30 seconds have elapsed the movable mask-substrate assembly is selectively moved such as by handle 66 over the first fixed mask so that the slot 60 aligns with the slot 56 in the first fixed mask. While the tungsten filament current is held at 25 amperes and the pressure in the chamber is maintained at or below $10^{-3}$ torr, the aluminum is deposited upon the substrate for a period of about 5 seconds. The length of the slots allows the strip of aluminum laid down upon the substrate to cover the two opposite indium patches 20 and 24, FIG. 1.

Exposing aluminum to oxygen.—Within 10 seconds after the aluminum disposition is completed the pressure in the chamber is increased, by admitting moisture-free oxygen ranging from 0.03 to 40 torr; the dry oxygen pressure may be maintained anywhere between the two limits. The aluminum film is oxidized by exposure to the oxygen for a period of time ranging from 1 to 15 minutes. The oxygen is then removed and the pressure within the vacuum chamber reduced to or below $10^{-3}$ torr.

Vaporizing lead.—A pellet of 99.99% pure lead is placed within a graphite crucible 62, the crucible being ¼ inch in diameter and ⅜ inch high with a 3/16 inch hole drilled to a depth of ¼ inch. A tantalum wire 64, 0.04 inch in diameter, is spiraled three times to form a wire basket to hold the graphite crucible. A current of 25 amperes is passed through the tantalum wire for about 30 seconds, the pressure in the chamber being at or below $10^{-3}$ torr. During the heating of the lead the mask-substrate assembly is positioned away from a first fixed mask 52a which is over the crucible. The fixed mask for this step is constructed in an identical manner to the mask used during the aluminum vaporization except the slot 56a cut in this fixed mask is oriented so that when the movable mask 58 is positioned over the fixed mask 52a the slot 61 of the movable mask aligns itself with the slot 56a of the fixed mask. By having the slots positioned as described, the lead will be deposited in a strip 1 mm. wide across the oxidized aluminum strip at right angles thereto such that the perpendicular configuration shown in FIG. 1 is achieved.

Deposition occurs after the lead has been heated for the 30 seconds by selectively positioning the movable mask over the fixed mask so as to align the slots 56a and 61. This position is held for about 10 seconds. Current in the tantalum wire is 25 amperes. Pressure during the deposition is around $10^{-3}$ torr. The distance between the fixed mask and the movable mask is about 1 mm., the same as it was during the aluminum vaporization.

Vaporization of tin.—In the alternative to vaporizing and depositing lead upon the aluminum oxide film, a film of tin may be used. To melt the tin a filament of molybdenum wire 0.04 inch in diameter is wound into a conical basket ½ inch deep by ¼ inch at its widest diameter. The turns of the basket are constructed tightly against each other so that tin granules may be placed inside the conical basket without falling through it. The tin is melted under a pressure of $10^{-3}$ torr inside the basket by passing a current of 45 amperes through the wire for a period of 90 seconds. The movable mask is then positioned and deposition of the tin takes place by passing a current of about 35 amperes through the wire basket for a period of about 20 seconds. The arrangement of the movable and fixed masks are identical to that used during the lead disposition.

Figures 5, 6:
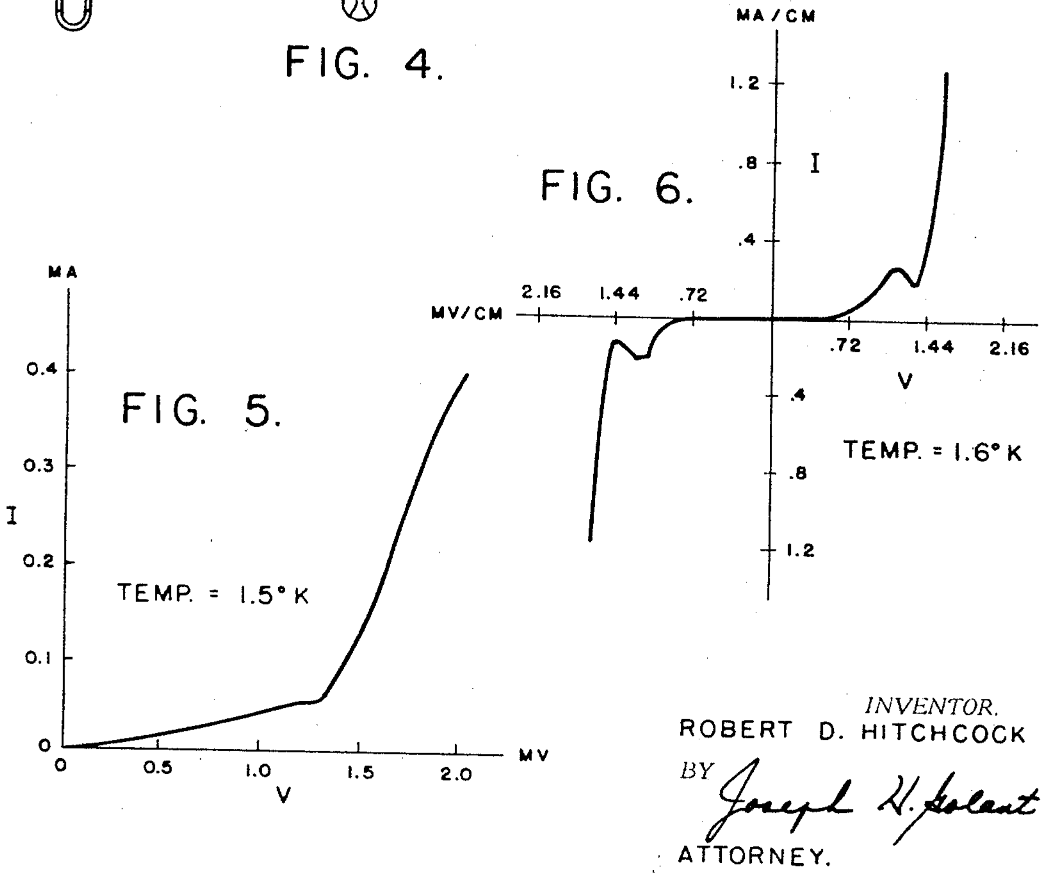
FIG. 5 is a D-C driven current-voltage graph illustrating electrical characteristics of the invention at a temperature of 1.5° K.
FIG. 6 is an A-C driven current-voltage graph illustrating electrical characteristics of the invention at a temperature of 1.6° K.

The above process is for constructing a diode consisting of a metal, oxide and metal sandwich. The aluminum-lead diode embodiment disclosed exhibits (when D-C driven) a current-voltage characteristic curve, FIG. 5, having an inflected region when the diode is immersed in liquid helium. This is caused by electron tunneling between the superconductive outer film 46 and the nonsuperconducting base film 42. At temperatures between 1.1 and 1.8° K. a negative resistance appears in the A-C driven characteristic curve, FIG. 6, of the aluminum-lead diode. A diode featuring a negative resistance region may be used to provide amplification or high frequency oscillation. Because of the unique quantum-mechanical properties of a superconductor, the superconductor tunnel diode can probably be used to amplify or produce frequencies above 300 gigacycles (1 gigacycle equals $10^9$ cycles per second). By contrast, thick-film or monolithic semiconductor devices cannot handle frequencies above about 10 gigacycles.

Several new techniques have been developed by the invention which help to create a dependable superconductive diode manufactured by a fairly economical and simple method. By providing a movable mask which may be held away from the heating metal and then moved into position for the quick deposition of a film, a vacuum of only $10^{-3}$ torr is required, i.e., the pressure need not be reduced much below $10^{-3}$ torr. As mentioned earlier, this is considerably easier to obtain than the prior art pressures of $10^{-6}$ torr which requires far more sophisticated and delicate instrumentation and equipment. Because two masks, instead of just one, separate the substrate from the source, the above method also does away with the need for special cooling facilities such as the liquid nitrogen which is called for in some of the prior art methods.

Another technique is that the oxidation of the aluminum based film is conducted with moisture-free oxygen; this ensures a stable oxide-film formation. Also the technique of depositing the second metal film, lead or tin, before the oxide layer is allowed to age helps in providing a consistently reliable diode. Finally, a unique feature of the lead deposition is the use of a graphite crucible instead of a tungsten or tantalum boat such as used in other methods. It is believed that vaporization of lead in the graphite crucible also helps eliminate the requirement of depositing the lead film at pressures around $10^{-5}$ torr or below. Furthermore, the graphite crucible is cheaper than a tungsten or tantalum boat.

Obviously many modifications and variations of the present invention are possible in the light of the above teachings. It is therefore to be understood that within the scope of the appended claims the invention may be practiced otherwise than as specifically described.

I claim:

1. Vacuum deposition method of vaporizing and depositing a film of electrode material on a substrate comprising the steps of:

disposing a fixed mask over and in close proximity to a source of electrode material, said mask having a shaped aperture, mounting said substrate for movement with a second mask movable in a plane disposed over and in close proximity to said fixed mask, said movable mask being provided with an aperture alignable with the aperture of said fixed mask, applying heat locally to said electrode material source at a pressure of about $10^{-3}$ torr for vaporizing said material, maintaining said masked substrate away from said localized heat source a distance sufficient for maintaining said substrate at an ambient temperature essentially unaffected by said heat, maintaining said heat and pressure for a fixed period of time sufficient to initiate vaporization, moving said substrate and second mask into said aperture-aligned position for permitting said vaporized material to contact said substrate, and maintaining said aligned position for another relatively shorter fixed period of time for depositing a film of a desired thickness, said heat and pressure conditions being maintained throughout said deposition period and said low ambient temperature of said substrate providing a relatively cool substrate surface capable of promoting relatively rapid vapor condensation for minimizing the fixed period of deposition time.

2. The method of claim 1 wherein the vacuum deposition steps are employed for providing a thin film superconductive diode formed of laminated layers of a base electrode material and a counterelectrode sandwiching an oxide layer of said base electrode material, and said base electrode material layer being a film vaporized and deposited in the manner defined in claim 1, and said counterelectrode material layer being deposited in the same manner as the base electrode material, said counterelectrode material layer utilizing a second fixed mask and a second localized heat source.

3. The method of claim 2 wherein said oxide layer is formed intermediate said base and counterelectrode materials by exposing said base electrode material to pure dry oxygen while maintaining an ambient pressure of between 0.03 to 40 torr.

References Cited

UNITED STATES PATENTS

| | | | |
|---|---|---|---|
| 3,259,759 | 7/1966 | Giaever | 307—88.5 |
| 3,359,466 | 12/1967 | Pollock | 317—234 |
| 3,379,568 | 4/1968 | Holmes | 117—212 |
| 3,271,192 | 9/1966 | Thun | 117—217 |

JOHN W. HUCKERT, *Primary Examiner.*

M. EDLOW, *Assistant Examiner.*

U.S. Cl. X.R.

117—106, 107, 215, 217; 317—234